United States Patent [19]

Levinstein et al.

[11] Patent Number: 4,555,842

[45] Date of Patent: Dec. 3, 1985

[54] METHOD OF FABRICATING VLSI CMOS DEVICES HAVING COMPLEMENTARY THRESHOLD VOLTAGES

[75] Inventors: Hyman J. Levinstein, Berkeley Heights; Sheila Vaidya, Bridgewater, both of N.J.

[73] Assignee: AT&T Bell Laboratories, Murray Hill, N.J.

[21] Appl. No.: 591,274

[22] Filed: Mar. 19, 1984

[51] Int. Cl.⁴ .................. H01L 21/265; H01L 21/22; H01L 29/78
[52] U.S. Cl. .................................. 29/571; 29/576 B; 29/576 T; 148/1.5; 148/187; 357/67
[58] Field of Search .................. 148/1.5, 187; 29/571, 29/576 B, 576 T; 357/67

[56] References Cited

U.S. PATENT DOCUMENTS

| | | | |
|---|---|---|---|
| 4,062,038 | 12/1977 | Cuomo et al. | 357/30 |
| 4,171,997 | 10/1979 | Irmler | 148/187 |
| 4,276,557 | 6/1981 | Levinstein et al. | 357/67 |
| 4,329,706 | 5/1982 | Crowder | 357/71 |
| 4,403,392 | 9/1983 | Oshima et al. | 29/569 R |
| 4,407,059 | 10/1983 | Sasaki | 29/571 |
| 4,411,734 | 10/1983 | Maa | 29/571 |
| 4,422,885 | 12/1983 | Brower et al. | 148/1.5 |
| 4,445,267 | 5/1984 | De La Moneda et al. | 29/571 |

OTHER PUBLICATIONS

"Refractory Silicides of Titanium and Tantalum for Low-Resistivity Gates and Interconnects", *IEEE Journal of Solid-State Circuits*, vol. SC-15, No. 4, Aug. 1980, S. P. Murarka, pp. 474-482.
"Reduced Geometry CMOS Technology", *International Electron Devices Meeting Digest*, 1982, J. Jerdonek et al., pp. 450-453.
"Twin Tub CMOS II—An Advanced VLSI Technology", *International Electron Devices Meeting Digest*, 1982, L. C. Parillo et al., pp. 706-709.
Tien et al., J. Appl. Phys. 54 (1983) 7047.
Neppl et al., J. Electrochem. Soc. 130 (1983) 1174.

*Primary Examiner*—Upendra Roy
*Attorney, Agent, or Firm*—Lucian C. Canepa

[57] ABSTRACT

For optimal performance, the threshold voltages $V_{TP}$ and $V_{TN}$ of the p- and n-channel transistors in a CMOS device should be the respective complements of each other. In polysilicon-gate devices, this can be achieved by adjusting the corresponding gate-metal work function utilizing p+ and n+ polysilicon for the respective gates of the p- and n-channel transistors. However, when a refractory metal silicide-over-polysilicon gate structure is employed in a VLSI CMOS device in which the gates of a pair of adjacent complementary transistors are connected together, an anomalously large negative $V_{TP}$ is measured.

The invention is a unique process sequence that achieves substantially complementary p- and n-channel transistor thresholds in a high-speed VLSI CMOS device that includes silicide-over-polysilicon gates.

25 Claims, 9 Drawing Figures

METHOD OF FABRICATING VLSI CMOS DEVICES HAVING COMPLEMENTARY THRESHOLD VOLTAGES

BACKGROUND OF THE INVENTION

This invention relates to semiconductor devices and, more particularly, to a method of fabricating very-large-scale-integrated (VLSI) devices of the complementary metal-oxide-semiconductor (CMOS) type.

It is known to utilize a refractory metal silicide on polysilicon to achieve a high-conductivity gate-level metallization for MOS devices. Specific examples of such silicide-on-polysilicon composite structures suitable for MOS devices are described in U.S. Pat. No. 4,276,557 of H. J. Levinstein, S. P. Murarka and A. K. Sinha, issued June 30, 1981. Additional details concerning the use of silicide-on-polysilicon composites in such devices are contained in an article by S. P. Murarka, D. B. Fraser, A. K. Sinha and H. J. Levinstein entitled, "Refractory Silicides of Titanium and Tantalum for Low-Resistivity Gates and Interconnects," *IEEE Journal of Solid-State Circuits*, Vol. SC-15, No. 4, Aug. 1980, pp. 474–482.

Increasingly, for many circuit applications of practical importance which require reduced power dissipation, devices of the CMOS type are being regarded as the preferred way to implement VLSI devices. Specific examples of CMOS devices suitable for such implementation are described in, for example, articles by R. Jerdonek, M. Ghezzo, J. Weaver and S. Combs, entitled "Reduced Geometry CMOS Technology," in the *International Electron Devices Meeting Digest*, page 451 (1982); and by L. C. Parrillo, L. K. Wang, R. D. Swenumson, R. L. Field, R. C. Melin and R. A. Levy, entitled "Twin Tub CMOS II—An Advanced VLSI Technology," in *International Electron Devices Meeting Digest*, page 706 (1982).

To achieve optimal performance of a CMOS circuit, it is known that the threshold voltages of the constituent p- and n-channel transistors of the device should be the respective complements of each other. In a polysilicon-gate VLSI CMOS device, complementary threshold voltages ($V_{TP}$, $V_{TN}$) are typically achieved by utilizing a so-called double-doped-polysilicon process in which the polysilicon gate work function is adjusted by utilizing appropriately doped p+ and n+ polysilicon.

In the course of trying to improve the performance of VLSI CMOS devices made by the double-doped-polysilicon process, it was natural to attempt to incorporate in the devices the speed advantages inherent in utilizing silicide-on-polysilicon composites as the gate-level metallization. Such attempts, however, revealed that the resulting devices, when the constituent transistors thereof were interconnected in a common circuit configuration, exhibited a serious problem, namely, an anomalously large negative $V_{TP}$.

Accordingly, workers in the art have expended efforts directed at trying to understand and solve the aforespecified problem. It was recognized that, unless solved, the problem posed a serious threat to the successful development of high-performance VLSI CMOS devices.

SUMMARY OF THE INVENTION

Hence, an object of the present invention is an improved method for fabricating VLSI CMOS devices. More specifically, an object of this invention is a method for making VLSI CMOS devices of the type that include silicide-on-polysilicon gate-level metallization and whose constituent transistors, however interconnected, consistently exhibit complementary threshold voltages.

Briefly, these and other objects of the present invention are realized in a specific illustrative embodiment thereof that comprises a method for fabricating VLSI CMOS devices that include silicide-on-polysilicon gate-level metallization. The method is based on applicants' conception of a phenomenological model that provided for the first time an adequate understanding of the aforestated anomalous behavior in such VLSI CMOS devices. In particular, applicants determined that the anomalously large $V_{TP}$ in the devices is primarily attributable to dopant exchange across the silicide-to-polysilicon interfaces of the composite gates formed in the devices. Based on such understanding, applicants devised a unique fabrication sequence that has been utilized successfully to make VLSI CMOS devices whose constituent transistors consistently exhibit complementary threshold voltages.

In accordance with applicants' inventive method, p-channel and n-channel transistors having silicide-on-polysilicon gates are fabricated in a VLSI CMOS device. The fabrication sequence is selected to minimize dopant depletion from the p+ polysilicon of the p-channel transistors and also to minimize dopant diffusion from the n+ polysilicon of the n-channel transistors into the p+ polysilicon of the p-channel transistors. In accordance with one illustrative approach, this is accomplished by locking dopants in place in the p+ and n+ polysilicon, by establishing a relatively low dopant concentration in the n+ polysilicon and by maintaining relatively low temperatures during the entire fabrication sequence so as to inhibit dopant redistribution.

More specifically, applicants' inventive method is directed to the fabrication of a VLSI CMOS device of the type that comprises complementary-threshold-voltage NMOS and PMOS transistors which include silicide-on-doped polysilicon gates. Illustratively, the method comprises: forming a polysilicon layer on a substrate, selectively introducing dopants into specified regions of the layer, forming a cap layer on the doped polysilicon layer, and heating the device with the cap layer in place to lock dopants in lattice sites in the specified regions of the polysilicon layer.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

It is well known that CMOS devices may be fabricated in either single-tub or twin-tub form. Herein, for illustrative purposes, emphasis will be directed to CMOS devices made in twin-tub form. But it is to be understood that the descriptive material pertaining to the fabrication of the particular devices described below is also applicable to single-tub CMOS implementations.

Also, it is to be understood that although emphasis herein will primarily be directed to arsenic as the n-type dopant, to boron (or boron difluoride) as the p-type dopant and to tantalum as the refractory metal whose silicide is employed in the described devices, other equivalent dopants and metals may be substituted therefor. Based on applicants' teachings, a variety of comparable VLSI CMOS devices that differ in particular details from the specific illustrative ones described below can be successfully fabricated.

Figure 1:
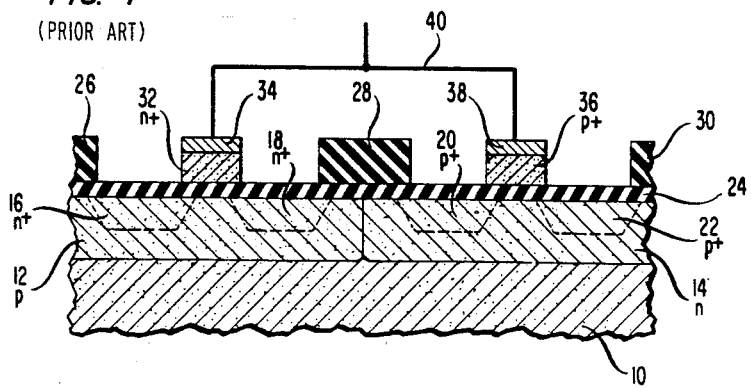
FIG. 1 is a schematic cross-sectional depiction, not drawn to scale, of a portion of a standard VLSI CMOS device known in the art; and, FIGS. 2 through 9 are schematic cross-sectional representations, also not drawn to scale, at various successive steps in a VLSI CMOS device fabrication procedure carried out in accordance with the principles of the present invention.

FIG. 1 shows a portion of a priorly known CMOS device configured as an inverter. The standard device comprises a lightly doped silicon substrate 10 having p-tub and n-tub regions 12 and 14, respectively, formed therein. In a conventional way, an n-channel (or NMOS) transistor comprising source and drain regions 16 and 18 is formed in the p-tub 12, and a p-channel (or PMOS) transistor comprising source and drain regions 20 and 22 is formed in the n-tub 14.

Overlying the top surface of the substrate 10 of FIG. 1 is a so-called gate-oxide layer 24 that comprises, for example, a 250-Angstrom-unit-thick layer of silicon dioxide. In turn, standard field-oxide portions 26, 28 and 30 are formed on the layer 24. These portions are each about 4000 Angstrom units thick and also comprise silicon dioxide.

The n-channel transistor depicted in the standard device of FIG. 1 includes a composite gate that comprises an n+ polysilicon portion 32 and a refractory metal silicide portion 34 that is made, for example, of tantalum silicide. Similarly, the p-channel transistor of FIG. 1 includes a composite gate that comprises a p+ polysilicon portion 36 and a tantalum silicide portion 38. Illustratively, the polysilicon portion 32 is doped with arsenic and the polysilicon portion 36 is doped with boron.

In one common inverter circuit configuration typically embodied in CMOS devices, the gates of respective pairs of complementary transistors are directly connected together. In FIG. 1, this is schematically represented by lead 40 which electrically interconnects the tantalum silicide portions 34 and 38 of the two aforedescribed adjacent n- and p-type transistors. In an actual CMOS device, the lead 40 comprises a runner made of tantalum silicide over polysilicon.

In a VLSI CMOS device of the type depicted in FIG. 1, the direct interconnection of adjacent gates of complementary transistors gives rise in practice to the aforedescribed anomalous $V_{TP}$ problem. In actual CMOS inverter embodiments in which the portions 34 and 38 of FIG. 1 are interconnected via a tantalum silicide runner, $V_{TN}$ of the n-channel transistor was measured to be approximately +0.7 volts. But $V_{TP}$ of the p-channel transistor in the device was measured to be in the range of −0.8 to −1.7 volts rather than the ideal desired value of approximately −0.7 volts. And, as previously stated, this problem threatened to thwart the successful further development of VLSI CMOS devices at about one-micrometer and smaller design rules.

Confronted with the aforespecified problem, applicants devised a model that adequately explains the aforespecified anomalous behavior. And, in light of the understanding embodied in that model, they then proceeded to devise a unique fabrication sequence that results in advantageous VLSI CMOS devices that do not exhibit the anomalous threshold-voltage behavior.

Applicants postulated that the aforedescribed anomalous behavior arises primarily due to dopant exchange across the silicide-to-polysilicon interfaces of the composite gates of the herein-considered VLSI CMOS devices. More specifically, applicants determined that, during elevated temperature processing of the CMOS device, boron segregates from the p+ polysilicon portions into the overlying tantalum silicide. Moreover, applicants determined that grain-boundary diffusion of arsenic in the silicide overlying the n+ polysilicon portions results in long-distance transport of arsenic dopant from n+ polysilicon portions to remote silicide-polysilicon interfaces. At these interfaces, uniform redistribution of the transported arsenic occurs. As a result, wherever gates of adjacent complementary transistors are connected together, the p+ polysilicon portion of the p-channel transistor is both depleted of boron and counterdoped by transported arsenic. Both phenomena cause $V_{TP}$ to become more negative. In practice, the deleterious consequence of these actions is that the absolute value of $V_{TP}$ is thereby established to be considerably greater than the absolute value of $V_{TN}$.

In accordance with the principles of the present invention, a VLSI CMOS device is fabricated in a particular fashion that eliminates or substantially reduces the aforedescribed depletion and diffusion phenomena. Hence, it is feasible to establish and reliably maintain prespecified complementary threshold voltages for the constituent transistors in the device during the entire fabrication sequence. Resulting adjacent p- and n-channel transistors in the completed device are thereby rendered ideally suited for use in circuit configurations such as inverters where the gates of adjacent transistors are directly interconnected. As mentioned earlier above, exactly or nearly exactly complementary transistor threshold voltages are desired in such configurations for optimal circuit operation.

Figure 2:
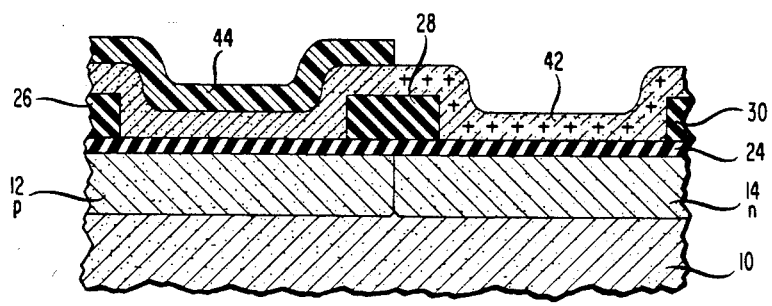

FIG. 2 shows a part of a specific illustrative VLSI CMOS device some of whose portions are identical to the corresponding portions described above and depicted in FIG. 1. These corresponding portions, which are identified in FIG. 2 and in subsequent figures by the same reference numerals employed therefor in FIG. 1, comprise: substrate 10, p-tub 12, n-tub 14, gate oxide 24 and field oxide portions 26, 28 and 30.

In accordance with the principles of the present invention, a 3000-to-4000 Angstrom-unit-thick layer 42 of polysilicon is formed (for example by low-pressure chemical vapor deposition) on the FIG. 1 device and then selectively implanted with a p-type dopant such as boron. Illustratively, this is done by masking the left-hand side of the polysilicon layer 42 with a blocking layer 44 of patterned photoresist and implanting boron (or boron difluoride) into the right-hand side of the layer 42. By way of a specific illustrative example, the dose and energy of the boron implant are selected to be about 4E15 ions per square centimeter and 30 kilo-electron-volts, respectively. The resulting boron ions in the polysilicon layer 42 are schematically depicted in FIG. 2 by plus signs. Advantageously, the right-hand side of the layer 42 is saturated with boron dopant.

Importantly, p-type dopants are implanted only on the PMOS side of the polysilicon layer 42 of FIG. 2. No such dopants enter the masked or NMOS side of the layer 42. If such dopants were allowed to enter the NMOS side of the layer 42, the subsequent dose of n-type dopants required to dope the NMOS side of the layer 42 to form n+ polysilicon would have to be higher than desired so as to counterdope the effect of p-type dopants on the NMOS side of the device. But such a higher dose would be inconsistent with applicants' overall goal of maintaining a relatively low concentration of n-type dopant in the device. (Higher concentrations of n-type dopant are instrumental in causing the above-specified anomalous threshold problem.)

Figure 3:
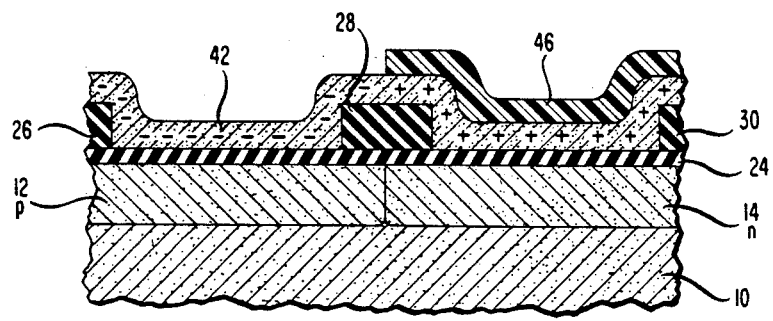

Next, the photoresist layer 44 (FIG. 2) is removed and a patterned blocking layer 46 of photoresist is formed overlying the right-hand or PMOS side of the polysilicon layer 42, as indicated in FIG. 3. An n-type dopant such as arsenic is then implanted into the uncovered portion of the layer 42, as schematically depicted by minus signs therein. By way of a specific illustrative example, the dose and energy of the arsenic implant are selected to be about 2E15 ions per square centimeter and 100 kilo-electron-volts, respectively.

An advantageous alternative for doping the polysilicon portion of the gate of the left-hand or NMOS transistor shown in the drawing herein will be specified later below. In accordance with that alternative, the arsenic doping step in which the unmasked left-hand side of the polysilicon layer 42 shown in FIG. 3 is implanted with n-type impurity, as described above, is omitted. For now, however, the left-hand side of the layer 42 will be assumed to have been doped, as indicated in FIG. 3.

Figure 4:
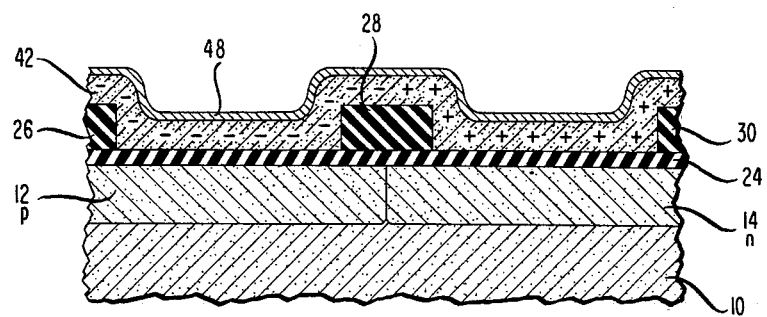

The next step in the above-described fabrication sequence is to remove the photoresist layer 46 shown in FIG. 3. In accordance with a feature of applicants' invention, a so-called cap layer 48 is then formed on the entire top surface of the polysilicon layer 42, as shown in FIG. 4. Illustratively, the cap layer 48 comprises a 300-Angstrom-unit-thick film of silicon dioxide formed during an annealing step at about 900 degrees Celsius for approximately 30 minutes in a dry oxygen atmosphere. The primary purpose of the cap layer 48 is to prevent depletion of boron dopant from the polysilicon layer 42 by evaporation or otherwise during a subsequent heating or lock-in step.

In accordance with a feature of applicants' invention, dopants in the polysilicon layer 42 are substantially locked in place during a heating step in which the cap layer 48 remains in place overlying the layer 42. Illustratively, this step comprises heating the device to about 950 degrees Celsius in a pure argon atmosphere for approximately 30 minutes. The effect of this heating step is to drive dopant into substitutional lattice sites in the polysilicon layer 42 thereby to form a solid solution in polysilicon. This step minimizes the likelihood that, in subsequent heating steps of the device fabrication sequence, boron and arsenic dopant will be able to move to any appreciable extent from the polysilicon layer 42 into an overlying silicide layer. Consequently, the probabilities of boron depletion of the polysilicon gates of p-channel transistors and of arsenic counterdoping thereof are also thereby substantially minimized.

Next, the cap oxide layer 48 is removed. Illustratively, this is done in a standard wet chemical removal step utilizing hydrofluoric acid. A silicide precurser layer 50 (FIG. 5) is then formed overlying the entire top surface of the doped polysilicon layer 42. By way of example, this typically involves co-sputter-depositing tantalum and silicon to a thickness of approximately 2500 Angstrom units, in a manner well known in the art. Other suitable techniques for forming the layer 50 are known.

Figure 5:
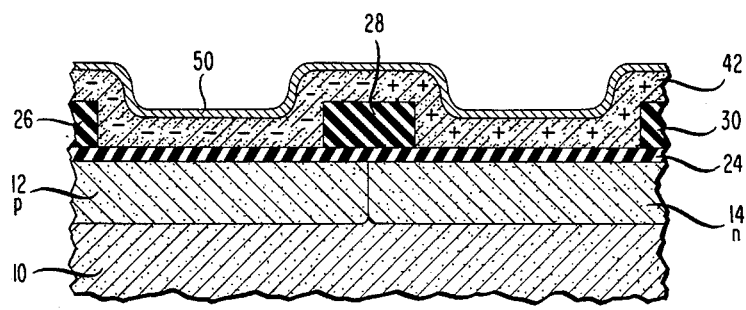

Subsequently, the tantalum-silicon layer 50 and the underlying polysilicon layer 42 of FIG. 5 are patterned in a conventional way in, for example, a standard reactive sputter etching procedure. Composite two-layer gates are thereby formed. Two such gates are shown in FIG. 6.

Figure 6:
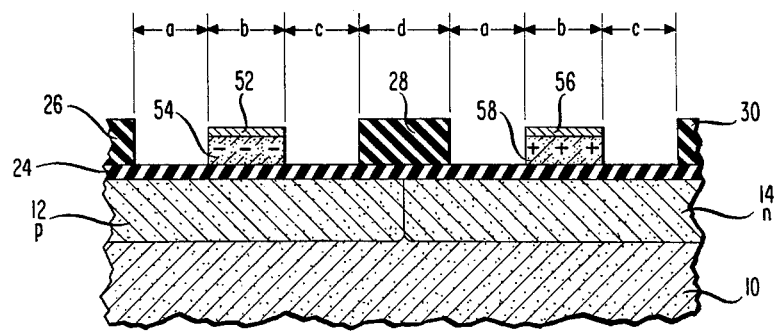

After the aforespecified patterning step, the device shown in FIG. 6 is heated for the purpose of sintering the tantalum-silicon layers 52 and 56 and converting them to a stable high-conductivity tantalum silicide compound. Heating is carried out, for example, at about 900 degrees Celsius for approximately 30 minutes in an argon atmosphere.

In FIG. 6, the gate of the left-hand or n-channel transistor comprises tantalum silicide layer 52 and arsenic-doped polysilicon layer 54. The gate of the right-hand or p-channel transistor comprises tantalum silicide layer 56 and boron-doped polysilicon layer 58. In one specific illustrative VLSI CMOS device made in accordance with applicants' inventive procedure, the dimensions a, b, c, and d indicated in FIG. 6 were approximately 2, 1, 2 and 4 micrometers, respectively.

Next, in a conventional deposition or oxidation step, silicon dioxide sidewalls, 60, 62, 64 and 66 (FIG. 7) each about 1000 Angstrom units thick are advantageously formed on the sides of the aforespecified composite gates. Then, as is known in the art but not shown in the drawing, it is feasible and advantageous in some VLSI CMOS devices of practical importance to form source and drain silicide regions on either side of each composite gate.

Figure 7:
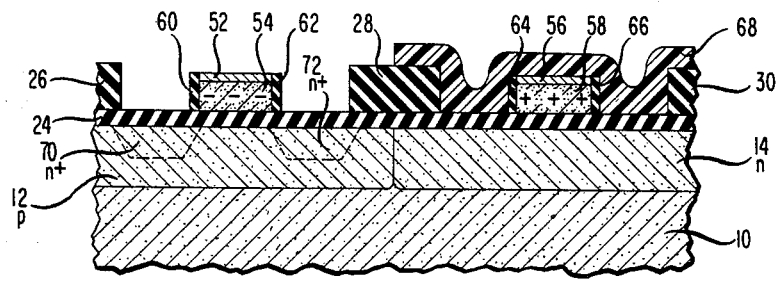

In accordance with applicants' fabrication sequence, the right-hand or PMOS side of the device depicted in FIG. 7 is then masked with a layer 68 of photoresist. A selective arsenic implant is then carried out to form source and drain regions 70 and 72 in the p-tub 12. At the same time, arsenic dopant is also thereby introduced into the silicide layer 52. Some of this latter dopant will, in a subsequent heating step, be driven from the layer 52 into the underlying polysilicon layer 54 to enhance the dopant level therein to achieve a predetermined relatively low total arsenic concentration partially determinative of $V_{TN}$. Illustratively, the dose and energy of the aforespecified arsenic implant are selected to be about 2E15 ions per square centimeter and 100 kilo-electron-volts, respectively.

As mentioned earlier above, an advantageous alternative exists for doping the polysilicon layer 54 of the left-hand or NMOS transistor of the device shown in FIG. 7. In accordance with this alternative, the priorly specified arsenic implant of the layer 42 described in connection with FIG. 3 is omitted. In that case, the polysilicon layer 54 shown in FIG. 7 is undoped prior to the NMOS source and drain implant. Accordingly, in this alternative approach, the arsenic dose of the implant which follows tantalum silicide deposition, etching, sidewall oxidation and sintering, is raised to about 3-to-4E15 ions per square centimeter. The source and drain regions are thereby defined essentially as before, but the arsenic concentration in the silicide layer 52 is initially thereby established to be approximately 1.5-to-2 times that specified earlier above. In this alternative approach, a subsequent heating step is effective to drive some of the arsenic dopant from the silicide layer 52 into the polysilicon layer 54 to establish an approximately uniform distribution of dopants across the silicide-to-polysilicon interface. As a result, the polysilicon layer 54 is thereby doped to the aforementioned relatively low concentration partially determinative of $V_{TN}$.

In the aforespecified alternative approach, no dopant is present in the n+ polysilicon gates during the dopant-lock-in heating step described earlier above. Thus, in that case no locking in of dopants occurs in the n+ polysilicon gates. Nevertheless, by maintaining relatively low dopant concentration and relatively low processing temperatures, the likelihood is exceedingly small that an appreciable amount of n-type dopant will diffuse from the polysilicon into the overlying silicide.

Figure 8:
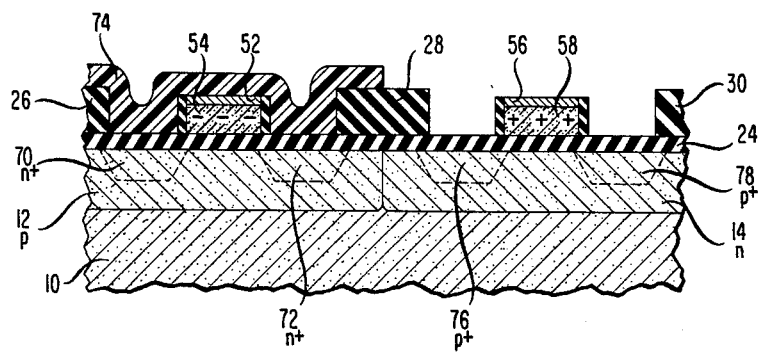

The next steps in applicants' fabrication sequence involve removing the photoresist layer 68 (FIG. 7) and then masking the left-hand or NMOS side of the device with a layer 74 of photoresist, as indicated in FIG. 8. A selective boron (or boron difluoride) implant is then carried out to form source and drain regions 76 and 78 in the n-tub 14. Although boron dopant is also thereby implanted in the silicide layer 56, very little of this implant will in practice be driven into the underlying polysilicon layer 58 during a subsequent heating step. Illustratively, the dose and energy of the boron implant are selected to be about 2E15 ions per square centimeter and 30 kilo-electron-volts, respectively.

Next, the photoresist layer 74 (FIG. 8) is removed and then the depicted device is subjected to an annealing step that activates the implanted dopants in the source and drain regions thereof. Annealing is carried out, for example, at about 900 degrees Celsius for approximately 30 minutes in an argon atmosphere. As a result of this heating step, arsenic and boron ions previously implanted into the tubs 12 and 14, respectively, are activated and driven vertically and laterally to form n+-p and p+-n junctions, in a manner well known in the art. Additionally, arsenic dopant ions in the silicide layer 52 are redistributed within the layer 52 and, further are driven from the layer 52 during this heating step into the underlying polysilicon layer 54. This latter action completes the formation of composite high-conductivity silicide-on-polysilicon gates and junctions in the CMOS device.

Figure 9:
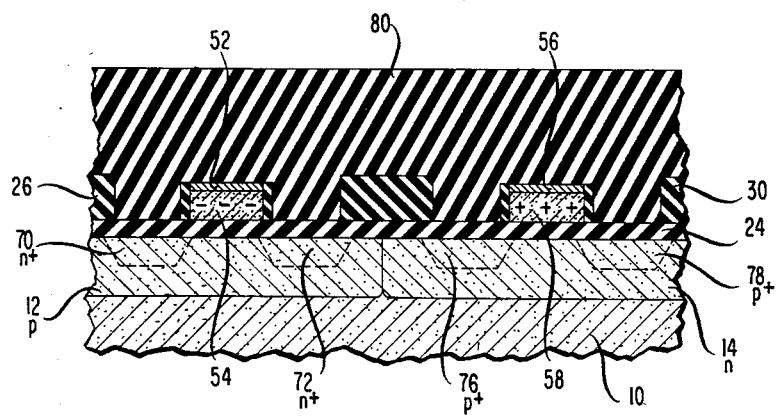

A relatively thick insulating layer (a so-called intermediate dielectric) is then formed on the entire top surface of the herein-considered VLSI CMOS device. Such a layer 80 is shown in FIG. 9. Illustratively, the layer 80 is approximately 1.5 micrometers thick. Advantageously, the layer 80 is formed in a standard CVD step from a source comprising tetraethylorthosilicate and triethyl phosphite. The resulting conventional material is commonly referred to as PTEOS glass, which exhibits excellent step coverage.

In further subsequent standard steps, contact windows are etched through specified portions of the glass layer 80 (FIG. 9) to access preselected surface regions of the underlying device structure. A suitable contact material is then deposited on the entire top surface of the layer 80 and in the aforespecified windows formed in the layer 80. Advantageously, the contact material comprises an aluminum layer. Thereafter, the aluminum layer is selectively etched in a conventional way to form a specified interconnection pattern. Further standard steps well known in the art are then employed to complete the fabrication of the herein-described VLSI CMOS device.

In accordance with applicants' aforedescribed fabrication procedure, dopant (boron) depletion from the p+ polysilicon layer 58 (FIG. 9) is minimized. At the same time, dopant (arsenic) diffusion from the n+ polysilicon layer 54 into the layer 58 is also minimized. As specified above, this is accomplished by locking dopants in place in the p+ and n+ polysilicon, by establishing a relatively low dopant concentration in the n+ polysilicon layer 54 and by maintaining relatively low temperatures during subsequent steps of the fabrication sequence. Significantly, the constituent transistors of the resulting VLSI CMOS devices made by applicants' procedure consistently exhibit threshold voltages that are substantially exactly complementary.

Finally, it is to be understood that the above-described arrangements and techniques are only illustrative of the present invention. In accordance with these principles, numerous modifications and alternatives may be devised by those skilled in the art without departing from the spirit and scope of the invention. For example, the above-described dopant lock-in step may in some cases of practical importance be performed without a cap layer in a rapid-thermal-annealing process such as can be performed with a laser.

What is claimed is:

1. A method of fabricating a CMOS device of the type that comprises substantially complementary-threshold-voltage NMOS and PMOS transistors which include silicide-on-doped polysilicon gates, said method comprising the steps of
    forming a polysilicon layer on a substrate,
    introducing p-type dopants only into regions of said layer from which PMOS-transistor gates are to be formed,
    driving substantially all of said dopants into lattice sites in said regions of said layer,
    and subsequently forming a silicide precursor layer on said polysilicon layer.

2. A method as in claim 1 further including the steps of
    etching said precursor and polysilicon layers to define composite gates,
    and sintering said device to convert said precursor layer to silicide.

3. A method as in claim 2 including the further steps of
    introducing n-type dopants only into NMOS source and drain regions of said substrate and into the silicide portions of the NMOS gates,
    and introducing p-type dopants only into PMOS source and drain regions of said substrate and into the silicide portions of the PMOS gates.

4. A method as in claim 3 including the further step of
    annealing said device to activate dopants in said source and drain regions and to redistribute dopant from the silicide portions of the NMOS gates into the underlying polysilicon portions to enhance the conductivity of said polysilicon portions.

5. A method as in claim 4 wherein the concentration of n-type dopant and the temperatures employed during fabrication of said device are selected to achieve a relatively low level of redistribution of n-type dopant from the polysilicon portions of the NMOS gates into the overlying silicide portions and to the polysilicon portions of the PMOS gates.

6. A method as in claim 5 wherein said driving step comprises
    forming a cap layer on said doped polysilicon layer, and heating said device with said cap layer in place to drive dopants into lattice sites in the specified regions of said layer.

7. A method as in claim 5 wherein said driving step comprises rapid thermal annealing of said device utilizing a laser.

8. A method of fabricating a CMOS device of the type that comprises substantially complementary-threshold-voltage NMOS and PMOS transistors which include silicide-on-doped polysilicon gates, said method comprising the steps of forming a polysilicon layer on a substrate, introducing p-type dopants only into regions of said polysilicon layer from which PMOS-transistor gates are to be formed, introducing n-type dopants only into regions of said polysilicon layer from which NMOS-transistor gates are to be formed, forming a cap layer on said doped polysilicon layer, and heating said device with said cap layer in place to drive dopants into lattice sites in the specified regions of said polysilicon layer.

9. A method as in claim 8 further including the steps of after said heating step, removing the cap layer from said polysilicon layer, forming a silicide precursor layer on said doped polysilicon layer, etching said precursor and polysilicon layers to define composite gates, and sintering said device to convert the remaining portions of said precursor layer to silicide.

10. A method as in claim 9 including the further steps of introducing n-type dopants only into NMOS source and drain regions of said substrate and into the silicide portions of the NMOS gates, and introducing p-type dopants only into source and drain regions of said substrate and into the silicide portions of the PMOS gates.

11. A method as in claim 10 including the further step of annealing said device to activate dopants in said source and drain regions and to redistribute dopant from the silicide portions of the NMOS gates into the underlying gate polysilicon to enhance the conductivity thereof.

12. A method as in claim 11 wherein said annealing step is carried out at a temperature of approximately 900 degrees Celsius.

13. A method as in claim 12 wherein said cap layer comprises silcon dioxide.

14. A method as in claim 13 wherein said p-type dopants are selected from the group consisting of boron and boron difluoride.

15. A method as in claim 14 wherein said n-type dopants comprise arsenic.

16. A method as in claim 15 wherein said silicide layer comprises tantalum silicide.

17. A method as in claim 8 wherein said dopant introducing step comprises introducing dopants only into regions of said polysilicon layer from which PMOS-transistor gates are to be formed.

18. A method as in claim 17 further including the steps of after said heating step, removing the cap layer from said polysilicon layer, forming a silicide precursor layer on said doped polysilicon layer, etching said precursor and polysilicon layers to define composite gates, and sintering said device to convert the remaining portions of said precursor layer to silicide.

19. A method as in claim 18 including the further steps of introducing n-type dopants only into NMOS source and drain regions of said substrate and into the silicide portions of the NMOS gates, and introducing p-type dopants only into PMOS source and drain regions of said substrate and into the silicide portions of the PMOS gates.

20. A method as in claim 19 including the further step of annealing said device to activate dopants in said source and drain regions and to drive dopant from the silicide portions of the NMOS gates into the underlying priorly undoped gate polysilicon to render said polysilicon electrically conductive.

21. A method as in claim 20 wherein said annealing step is carried out at a temperature of approximately 900 degrees Celsius.

22. A method as in claim 21 wherein said cap layer comprises silicon dioxide.

23. A method as in claim 22 wherein said p-type dopants are selected from the group consisting of boron and boron difluoride.

24. A method as in claim 23 wherein said n-type dopants comprise arsenic.

25. A method as in claim 24 wherein said silicide layer comprises tantalum silicide.

* * * * *